United States Patent [19]

Buchner

[11] 4,177,445

[45] Dec. 4, 1979

[54] CONTACTLESS SWITCHING ELEMENT FOR ELECTRIC CURRENT

[75] Inventor: Helmut Buchner, Wendlingen, Fed. Rep. of Germany

[73] Assignee: Daimler-Benz Aktiengesellschaft, Fed. Rep. of Germany

[21] Appl. No.: 880,610

[22] Filed: Feb. 23, 1978

[30] Foreign Application Priority Data

Feb. 24, 1977 [DE] Fed. Rep. of Germany ....... 2707956

[51] Int. Cl.² .......................................... H01H 37/72
[52] U.S. Cl. .................................. 338/34; 73/27 R; 337/324; 337/336; 338/14; 338/36
[58] Field of Search ...................... 338/14, 26, 30, 34, 338/36; 73/27; 204/1 T; 337/299, 324, 326, 329

[56] References Cited

U.S. PATENT DOCUMENTS

| 2,332,392 | 10/1943 | Minter | 338/36 X |
|---|---|---|---|
| 3,242,717 | 3/1966 | Matle | 73/27 R |
| 3,271,719 | 9/1966 | Ovshinsky | 338/34 X |
| 3,390,365 | 6/1968 | Lindberg | 337/299 |
| 3,417,009 | 12/1968 | Holden | 204/1 T |
| 3,567,383 | 3/1971 | Langley | 73/27 X |
| 4,016,524 | 4/1977 | Pompei | 338/34 |

*Primary Examiner*—Richard R. Kucia
*Attorney, Agent, or Firm*—Craig and Antonelli

[57] ABSTRACT

A contactless switch element for electric currents, which is constructed as a hydrogen-diffusion-impervious but electrically non-conductive, encapsulated metal adapted to be reversibly hydrogenated or dehydrogenated.

25 Claims, 5 Drawing Figures

CONTACTLESS SWITCHING ELEMENT FOR ELECTRIC CURRENT

The present invention relates to a contactless switching element for electric currents.

With a high switching frequency or with large current magnitudes to be switched, a burning of the contacts or a corrosion of the contacts occurs in due course. With a far advanced burning of the contacts, the contacts or the entire switch have to be replaced; with contact corrosion, the contact resistance between the switch contacts may increase to an unacceptable level which also requires replacement of the switch.

It is the aim of the present invention to provide a contactless switch element for electric currents, by means of which current can be switched effectively and permanently, especially current of large magnitude.

The underlying problems are solved according to the present invention in that the switch element is constructed as a hydrogen-diffusion-impervious but electrically non-conductive, encapsulated metal adapted to be hydrogenated or dehydrogenated.

If hydrogen is incorporated in metals capable of absorbing hydrogen or in such metal alloys, then the binding takes place metallically, i.e., hydrogen gives off the electron to the conductivity band in the metal whereby the electron density in the conductivity band increases up to complete saturation. In the fully occupied conductivity band, the electron movability is then zero or strongly reduced so that the initially electrically conductive metal becomes a non-conductor as a result of the hydrogen inclusion. This process is completely reversible in the closed system; that is, by desorption of hydrogen out of the hydride, the original conductivity of the metal is again adapted to be re-established.

By suitable influencing of the hydrogen pressure in the interior of the encapsulation and/or of the temperature of the switch elements, a hydrogenating or dehydrogenating of the metal of the switch elements and therewith an opening or closing of the switch can be brought about.

In order to accelerate the gas exchange over the entire cross section of the switch element, the latter can be constructed as a porous compressed blank or as sintered body or as stranded twist. A hydrogen donor can be connected to the interior of the encapsulation, which may appropriately contain also a hydrogen-impervious encapsulated metal adapted to be hydrogenated or dehydrogenated. This hydrogen donor may be provided with a heat source adapted to be selectively engaged and with means for the cooling off, for example, with cooling ribs. For purposes of accelerating the heat transfer in the porous metal hydride of the hydrogen donor, chips or the like of a good conductive metal which is not adapted to be hydrogenated, may be embedded in the compressed body or sintered body of this aggregate. For example, copper or aluminum chips would be suitable for that purpose.

Accordingly, it is an object of the present invention to provide a contactless switch element for electric currents which avoids by simple means the aforementioned shortcomings and drawbacks encountered in the prior art.

Another object of the present invention resides in a contactless switch element for electrical currents, which obviates the problems resulting from contact burning and/or contact corrosion.

A further object of the present invention resides in a contactless switch element for electric currents which assures long life without the need for repair or replacement.

Still another object of the present invention resides in a contactless switch element for electric currents, in which the contact resistance remains substantially constant over long periods of operation.

A further object of the present invention resides in a contactless switch element for electric currents capable of switching large current magnitudes in an effective and appropriate manner.

These and other objects, features and advantages of the present invention will become more apparent from the following description when taken in connection with the accompanying drawing which shows, for purposes of illustration only, several embodiments in accordance with the present invention and wherein.

Figure 1:
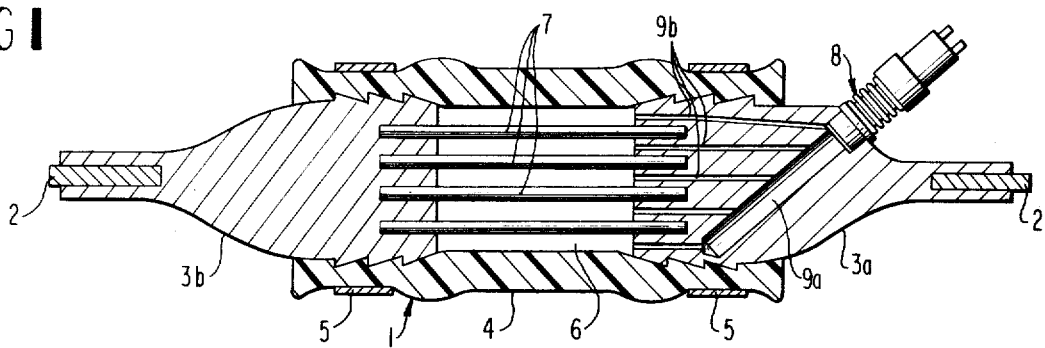
FIG. 1 is a longitudinal cross-sectional view through a switch in accordance with the present invention.

Referring now to the drawing and more particularly to FIG. 1, the switch generally designated by reference numeral 1 which is illustrated in this figure in longitudinal cross section, represents an electrical and mechanical connecting element between the two ends of the cable strand 2 which are soldered-in or pressed into dead-end bores of cable lugs or cable shoes 3a and 3b. The cable lugs or shoes 3a and 3b are made of good electrically conductive material as is also the cable section 2, such as, for example, of copper. The cable lugs or shoes 3a and 3b have an approximately bottle-shaped configuration. Several dead-end bores are provided at the mutually facing enlarged end surfaces perpendicular to the axis, into which are soldered the rod-shaped switch elements 7 of a metal adapted to be hydrogenated and dehydrogenated. A hose-shaped encapsulation of heat-resistant but electrically non-conductive material is placed about the cable shoes and is secured in a pressure-tight and tension-proof manner at the cable shoes by means of sealing clamps 5. The hollow space 6 enclosed by the encapsulation is hermetically closed off with respect to the outside. A hydrogen donor 8 is threadably connected in the right cable shoe 3a, which is illustrated in detail in FIG. 2. The hydrogen developed by the hydrogen donor 8 is conducted to the hollow space 6 by way of hydrogen supply bores 9a and 9b and is conducted back out of the hollow space 6 into the hydrogen donor 8 through these bores.

The rod-shaped switch elements 7 of metal hydride may be constructed as form-rigid compressed parts or blanks or as sintered bodies of a granulation of metal adapted to be hydrogenated. For favoring a gas-exchange on the inside of the rod-shaped switch elements, the latter may have a pore volume of about 5% to about 10%. As good as possible a metallic contact must be present at the contact or sinter boundaries, in order that the electrical resistance of such a body is as low as possible in the metallic, i.e., dehydrogenated condition. In lieu of porous, rod-shaped switch elements, also twisted strands of thin metal wires may be installed into the switch. The construction of such a rod as stranded twist permits by reason of the interstices between the individual wires, also a rapid gas exchange. The lateral spacing of the individual rod-shaped switch elements may, in reality, be considerably narrower than shown in the drawing. The subdivision of the entire electrically conductive cross section within the area of the switch element into several individual cross sections has been undertaken in order to obtain as rapid as possible a pressure equalization in the longitudinal direction of the switch elements. However, a solid cylindrical piece could also be arranged in the hollow space 6, in which several axially extending hydrogen distribution bores are arranged, which pass over into the bores 9b. Such a solid cylindrical body as switch element adapted to be hydrogenated would have to be connected at its end faces also in an electrically good conductive manner with the cable shoes 3a and 3b; for example, it could be soldered thereto.

The operation of the switch according to FIG. 1 is now briefly as follows:

By activating the hydrogen donor 8, the operation of which will be described more fully hereinafter, the donor develops hydrogen and places the hollow space 6 under a considerable pressure. As a result thereof, the diffusion equilibrium is displaced in the direction toward a hydrogenation of the switch element 7. The switch elements 7 which are metallic at low hydrogen pressure and thus are electrically conductive, are hydrogenated by an increase of the hydrogen pressure in the space 6 and pass over into the electrically non-conductive condition thereof. As a result thereof, the two cable shoes 3a and 3b are electrically separated from one another.

By turning off the hydrogen donor 8, the latter again absorbs in itself the previously developed hydrogen and the pressure in the bores 9a and 9b and in the receiving space 6 decreases as a result thereof. Consequently, the diffusion equilibrium is again displaced in the direction toward dehydrogenation; the switch elements 7 again pass over into the metallic and electrically good conductive condition.

Figure 2:
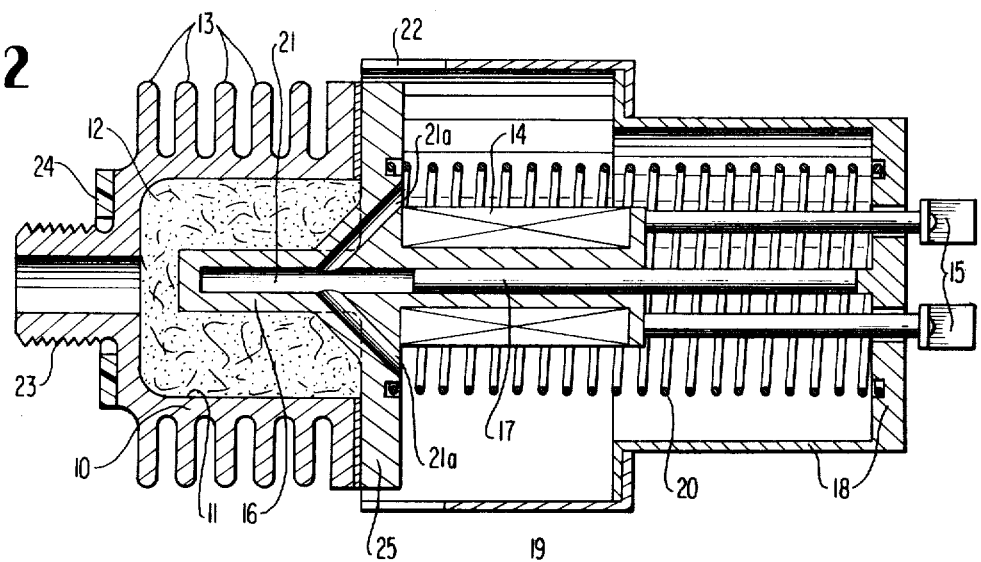
FIG. 2 is a longitudinal cross-sectional view through a hydrogen donor in accordance with the present invention for use with the switch according to FIG. 1.

The hydrogen donor 8 illustrated in detail in FIG. 2 also operates by means of a metal adapted to be hydrogenated or dehydrogenated. This hydrogen donor 8 includes an encapsulating member 10 which is formed of a metal which is not adapted to be hydrogenated, but is a good heat conductor. The hollow space 11 formed therein is filled with a compressed blank of a granulation of metal granules adapted to be hydrogenated. Also the heat conductivity of this compressed blank in the hydrogenated condition can be fostered if chips of copper and/or aluminum are also pressed together with the metal hydride granules. A pore volume of about 5 to about 10% is also provided in this compressed blank for inducing a gas-exchange. For favoring a cooling off by the ambient air, the encapsulating member 10 is provided on its outside with a plurality of cooling ribs 13. The encapsulating member of the hydrogen donor 8 is adapted to be screwed into the open end of the hydrogen distribution bore 9a of the cable shoe 3a by means of the threaded connection 23 thereof. The connecting place is hermetically sealed by the seal 24.

The other end face of the encapsulation 10 is enclosed by a heating element. A heat-conductor core 16 which extends into the interior of the metal hydride filling, is concentrically provided at the disk-shaped cover 25 which, as will be pointed out more fully hereinafter, serves as yoke or return pole piece. This heat-conducting core 16 continues to extend coaxially on the opposite side. On this side, the heat conductor core 16 is provided with a heating coil 14. The connections for this heating coil 14 are extended outwardly by way of axially extending insulated spacer pins—connections 15. By energizing the coil 14, the coil heats up and with it also the heat-conducting pin 16. The heat generated in the coil 14 is transmitted by the heat-conducting pin 16 into the interior of the filling of the compressed metal hydride blank. The coil 14 is so constructed that it produces a magnetic field. The heat-conducting core 16 and the yoke plate 25 are constructed of magnetizable material so that they become magnetic when the winding 14 is energized. A bore 21 is provided in the interior of the heat-conductor core 16, in which a movable magnet core 17 is able to slide. The magnet core 17 carries an iron casing or sheath 18 axially movable in unison therewith. In the de-energized condition, the core 17 and the iron casing are displaced by a return spring 20 into the illustrated withdrawn position. As a result thereof, the convection shield 19 of non-magnetizable material which is connected with the iron casing 18 is displaced into the right position, in which the cooling ribs 13 are exposed. By energizing the coil 14, the movable magnet core 17 is pulled into the interior of the axial bore 21; additionally, the iron casing 18 is attracted by the yoke 25 against the force of the spring 20. As a result thereof, the convection shield 19 is slipped over the cooling ribs 13 and a convective heat loss at the cooling ribs 13 is strongly reduced. With a continuing engagement of the energizing current for the winding 14, the latter heats the heat-conducting core 16 and with the latter the filling 12. As a result thereof—starting from a hydrogenated condition of the compressed body 12—hydrogen is released therefrom, which leaves by way of the connection 23 and is able to reach the accommodating space 6 of the switch 1 by way of the bores 9a and 9b. By reason of a heating-up of the compressed body 12, quite considerable hydrogen pressures can be exerted in the receiving space 6 because—in relation to the volume—metal hydrides are able to absorb hydrogen in quantities several hundred times and are able to again give off the same. By de-energization of the coil 14, the cooling ribs 13 are again exposed by the return spring 20; additionally, the convection bores 21a arranged transversely to the axial bore 21 are exposed by the retracted core 17. Additionally, convection openings 22 are provided in the convection shield 19 at the top and bottom thereof. As a result thereof, a convective cooling off of the compressed part or blank 12 is possible not only on the outside along the cooling ribs 13 but also in the inside of the heat-transfer core 16 by way of bores 21 and 21a. As a result thereof, the compressed body or blank 12 is able to again absorb the previously developed hydrogen and to bind the same in the metal hydride.

The two metal hydrides which can be used in the switch element 7 on the one hand and in the compressed blank 12 of the hydrogen donor 8, on the other, may have the same pressure/temperature curves. The metal hydride in the hydrogen donor is dehydrogenated by temperature influence and causes thereby a strong pressure increase in the hollow space 6 of the switch 1. The increase of this diffusion pressure effects again a hydrogenating of the switch elements 7.

Figure 3:
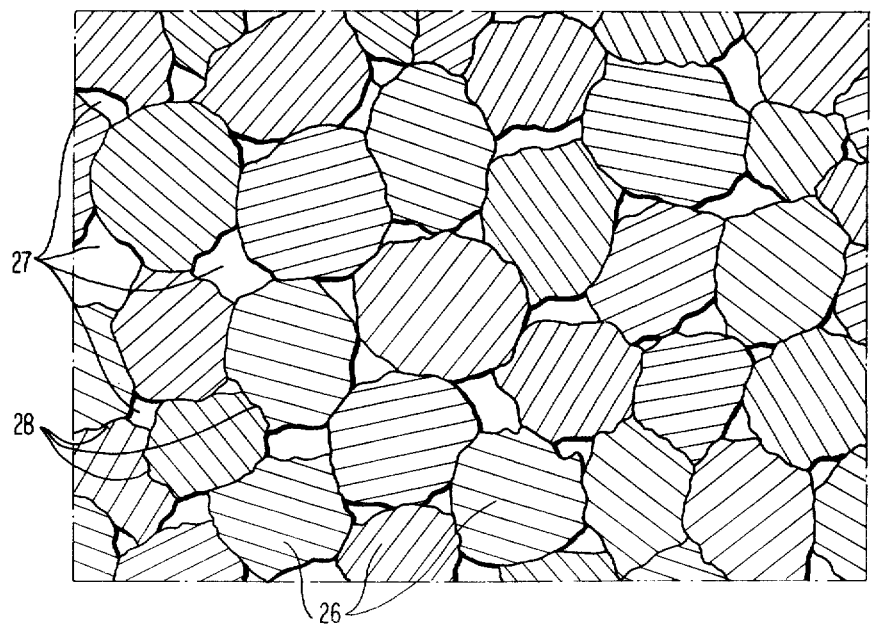
FIG. 3 is a section on a greatly enlarged scale of the granulated cross section of a switch element in accordance with the present invention.

In the portion of a cross section through a compressed part or blank, illustrated in FIG. 3, granules of a metal 26 adapted to be hydrogenated are pressed together into a form-rigid blank under inclusion of a large number of pores 27. The contact places 28 between the individual granules should be of as large an area as possible and should be as intimate as possible so that a good electrical current conduction and therewith as small as possible an electrical resistance occurs in the metallic condition of the granules. A suitable material is, for example, a magnesium-nickel alloy ($Mg_2Ni$).

Figure 5:
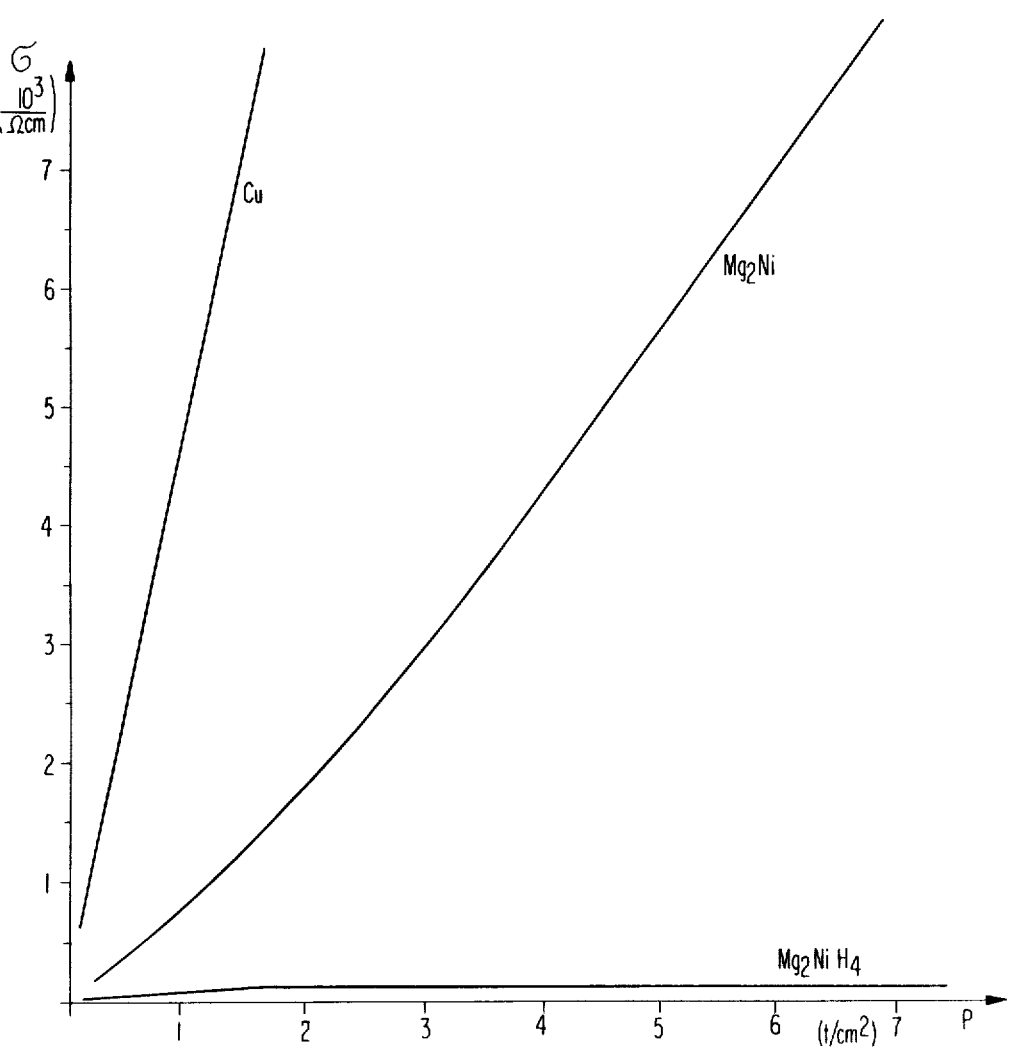
FIG. 5 shows resistance curves of a metal hydride in the hydrogenated and dehydrogenated condition.

The resistance curves of different materials are plotted in FIG. 5 as a function of the compression pressure, by means of which metal granules are pressed together into an electrical conductor. The characteristic curve for copper is plotted for purposes of comparison which rises very rapidly. The curve for the metallic magnesium-nickel alloy also has a relatively steep rise. The curve for this material in the hydrogenated condition extends within the area of the abscissa axis, i.e., the electric conductivity remains constantly poor independently of the compression pressure. In the hydrogenated condition, this material is therefore a good insulator. The conductivity values in the hydrogenated condition compared to the dehydrogenated condition differ from one another at least by a factor of 50. With the use of sintered bodies or with the use of stranded twists or lamellates, this ratio becomes even more favorable.

Figure 4:
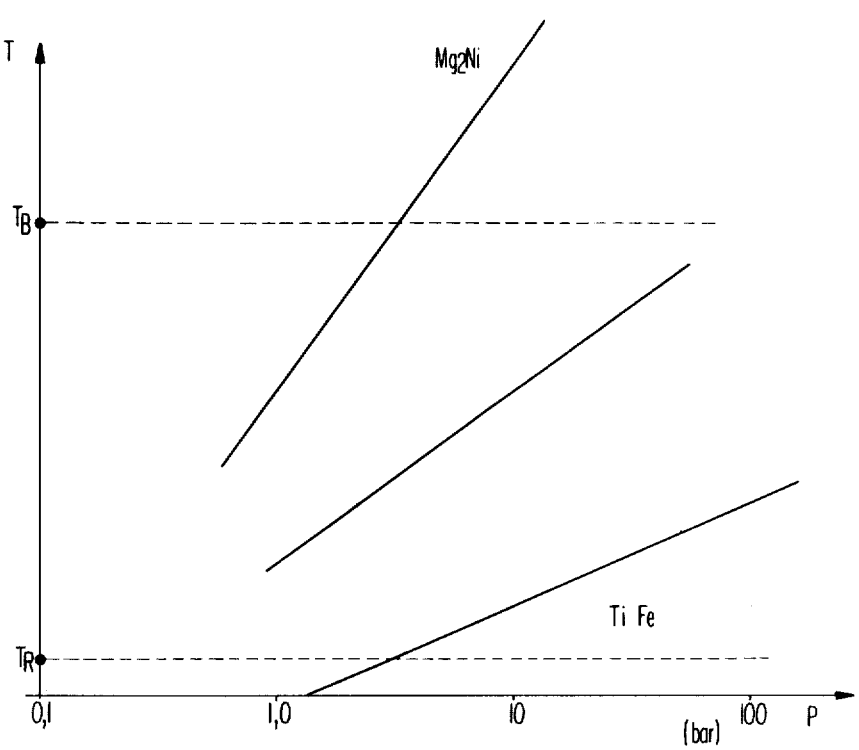
FIG. 4 is a pressure/temperature diagram indicating the configuration of the curves of different metal hydrides usable with the present invention.

Curves of different metals or metal alloys which can be reversibly hydrogenated, are shown in FIG. 4. The curves of the different materials lie within different temperature ranges. For example, the curve of titanium iron extends to below the room temperature $T_R$. The curve of magnesium-nickel ($Mg_2Ni$) extends on both sides of an operating temperature $T_B$ of about 250° to about 300° C.

The selection of a suitable material adapted to be hydrogenated takes place according to appropriateness and by reference to the respective conditions of a given application.

While I have shown and described several embodiments in accordance with the present invention, it is understood that the same is not limited thereto but is susceptible of numerous changes and modifications as known to those skilled in the art, and I therefore do not wish to be limited to the details shown and described herein but intend to cover all such changes and modifications as are encompassed by the scope of the appended claims.

I claim:

1. A contactless switch for electric currents comprising:
    (a) a switch body defining a hollow space;
    (b) metal switch element means operable to be reversibly hydrogenated and dehydrogenated for rendering said switch element means electrically non-conductive and electrically conductive, respectively, said switch element means being positioned within said hollow space;
    (c) hydrogen donor means in pressure-tight communication with said hollow space, said donor means containing a hydrogen donor metal that is operable to be dehydrogenated and hydrogenated in response to heating and cooling of said donor metal, respectively, and
    (d) means for increasing and decreasing the temperature of said donor metal.

2. A switch according to claim 1, characterized in that the switch element means is operable to be selectively placed under increased hydrogen pressure and pressure-relieved.

3. A switch element according to claim 2, characterized in that the metal operable to be hydrogenated of at least one of the switch element and of the hydrogen donor means is porous.

4. A switch according to claim 3, characterized in that the metal operable to be hydrogenated of both the switch element means and of the hydrogen donor means are porous.

5. A switch according to claim 3, characterized in that the metal operable to be hydrogenated of the switch element means is constructed as twisted strands.

6. A switch according to claim 3, characterized in that the metal operable to be hydrogenated of the switch element means is constructed as a lamellate.

7. A switch according to claim 3, characterized in that the metal of at least one of the switch element means and of the hydrogen donor means that is operable to be hydrogenated is constructed as a sintered body of metal granules.

8. A switch according to claim 7, characterized in that the sintered body is relatively gap- and crack-free.

9. A switch according to claim 8, characterized in that the metal of the hydrogen donor means that is operable to be hydrogenated is constructed as a form-rigid compressed blank of metal granules.

10. A switch according to claim 8, characterized in that the sintered body of the hydrogen donor metal contains metal parts such as chips, wires, granulates or granules of good heat-conducting metals which are not operable to be reversibly hydrogenated and dehydrogenated in a hydrogen atmosphere.

11. A switch according to claim 10, characterized in that said metal parts are selected from the group consisting of aluminum or copper and their alloys.

12. A switch according to claim 10, characterized in that the donor metal of the hydrogen donor means is enclosed in a housing that consists of a good heat-conducting material.

13. A switch according to claim 12, characterized in that said housing material is metallic.

14. A switch according to claim 12, characterized in that said housing material is aluminum.

15. A switch according to claim 12, characterized in that the pore volume of the metal of at least one of the switch element and of the hydrogen donor means which is operable to be hydrogenated amounts to about 5 to 10%.

16. A switch according to claim 15, characterized in that the pore volume of the metal of both the switch element and of the hydrogen donor means that is operable to be hydrogenated amonts to about 15 to 10%.

17. A switch according to claim 16, characterized in that the housing of the hydrogen donor is provided at a place of external heat influence with a surface configuration means that is conductive to the transfer of heat between the housing and the means for increasing and decreasing temperature and from the housing to the donor metal.

18. A switch according to claim 3, characterized in that the metal of at least one of the switch element and of the hydrogen donor means which is operable to be hydrogenated is constructed as a form-rigid compressed blank of metal granules.

19. A switch according to claim 18, characterized in that the hydrogen donor metal contains metal parts such as chips, wires, granulates or granules of good heat-conducting metals which are not operable to be reversibly hydrogenated, respectively, dehydrogenated in a hydrogen atmosphere.

20. A switch according to claim 1, characterized in that the donor metal of the hydrogen donor means is enclosed in a housing that consists of a good heat-conducting material.

21. A switch according to claim 20, characterized in that the housing of the hydrogen donor means is provided at a place of external heat influence with a surface configuration means that is conducive to the transfer of heat between the housing and the means for increasing and decreasing temperature and from housing to the donor metal.

22. A switch according to claims 17 or 21, wherein the surface configuration includes cooling ribs on said housing and said means for decreasing the temperature of the donor metal comprises shield means that is displaceable between a first position exposing and a second position covering said ribs with respect to convection cooling currents, respectively.

23. A switch according to claim 22, comprising spring means for biasing said shield means toward said first position and electromagnetic means for displacing said shield means to said second position.

24. A switch according to claim 23, wherein the means for increasing the temperature of the donor metal comprises a heating coil, said heating coil forming part of said electromagnetic means.

25. A switch according to claim 1, characterized in that the pore volume of the metal of at least one of the switch element and of the hydrogen donor means that is operable to be hydrogenated amounts to about 5 to 10%.

* * * * *